US011523532B2

(12) United States Patent
Liu (10) Patent No.: US 11,523,532 B2
(45) Date of Patent: Dec. 6, 2022

(54) ELECTRONIC DEVICE CASING (71) Applicant: PEGATRON CORPORATION, Taipei (TW)

(72) Inventor: Yu-Wen Liu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 161 days.

(21) Appl. No.: 17/091,958

(22) Filed: Nov. 6, 2020

(65) Prior Publication Data
US 2021/0153371 A1  May 20, 2021

(30) Foreign Application Priority Data
Nov. 19, 2019  (TW) .................................. 108141971

(51) Int. Cl.
*H05K 7/00* (2006.01)
*H05K 7/14* (2006.01)
*H05K 5/02* (2006.01)

(52) U.S. Cl.
CPC ........... *H05K 7/1411* (2013.01); *H05K 5/023* (2013.01); *H05K 5/0221* (2013.01)

(58) Field of Classification Search
CPC .. H05K 7/1411; H05K 7/1409; H05K 7/1488; H05K 5/0221; H05K 5/023
USPC ........... 312/332.1, 223.2; 361/801, 798, 754, 361/759, 732, 747, 727
See application file for complete search history.

(56) References Cited

U.S. PATENT DOCUMENTS

| 4,197,821 A * | 4/1980 | Sawada .................... F02P 5/103 123/406.69 |
| 6,058,579 A * | 5/2000 | Brocklesby ........... H05K 7/1409 340/687 |
| 6,094,353 A * | 7/2000 | Koerber ............ H01R 13/62933 361/801 |
| 6,266,248 B1 * | 7/2001 | Hanas ................... H05K 7/1409 361/752 |
| 6,395,976 B1 * | 5/2002 | Koradia ............... H05K 7/1409 361/801 |
| 10,317,949 B1 * | 6/2019 | Lin ......................... H05K 5/023 |
| 2005/0014403 A1 * | 1/2005 | Joist ..................... H05K 7/1409 439/157 |
| 2007/0002550 A1 * | 1/2007 | Strmiska .............. H05K 7/1409 361/798 |
| 2008/0024046 A1 * | 1/2008 | Juan ........................ A47B 95/02 |

(Continued)

FOREIGN PATENT DOCUMENTS

| CN | 112911882 | * | 6/2021 |
| TW | M255623 | | 1/2005 |

*Primary Examiner* — Janet M Wilkens
(74) *Attorney, Agent, or Firm* — J.C. Patents (57) ABSTRACT An electronic device casing includes a body, a movable apparatus, and a handle structure. The body comprises a first stopping surface and a second stopping surface disposed opposite to each other. The movable apparatus is adapted to be detachably assembled in the body. The handle structure is pivotally disposed to the movable apparatus. The handle structure comprises a first arm corresponding to the first stopping surface and a second arm corresponding to the second stopping surface. The movable apparatus is adapted to move between a removed position and an assembled position by rotating the handle structure between an upper pulled position and a lower pressed position.

16 Claims, 10 Drawing Sheets (56) References Cited

U.S. PATENT DOCUMENTS

2008/0101040 A1* 5/2008 Tang .................. H05K 7/1411
361/727
2021/0153368 A1* 5/2021 Ye ........................ H05K 5/023

* cited by examiner

ELECTRONIC DEVICE CASING

CROSS-REFERENCE TO RELATED APPLICATION

This application claims the priority benefit of Taiwan application serial no. 108141971, filed on Nov. 19, 2019. The entirety of the above-mentioned patent application is hereby incorporated by reference herein and made a part of this specification.

BACKGROUND

Technical Field

The disclosure relates to an electronic device casing, and in particular to an electronic device casing with a handle structure.

Related Art

A conventional server product is mainly divided into a body and multiple movable apparatuses movably disposed in the body. Generally, each movable apparatus is provided with a handle so that it can be easily extracted or pulled out. After the movable apparatus is assembled to a predetermined position, the movable apparatus is additionally fixed in the body with a locking hook structure. However, the handle and the locking hook structure function individually, thereby leading to complex operation and inconvenience of use.

SUMMARY

The disclosure provides an electronic device casing capable of reducing complexity in operation and improving convenience of use.

An electronic device casing of the disclosure includes a body, a movable apparatus, and a handle structure. The body comprises a first stopping surface and a second stopping surface disposed opposite to each other. The movable apparatus is adapted to be detachably assembled in the body. The handle structure is pivotally disposed to the movable apparatus and comprises a first arm corresponding to the first stopping surface and a second arm corresponding to the second stopping surface. The handle structure is rotatable between a lower pressed position and an upper pulled position to adapt the movable apparatus to move between an assembled position and a removed position. When the handle structure is rotated forward from the upper pulled position to the lower pressed position, the first arm moves toward the first stopping surface until abutting the first stopping surface, and the handle structure, by using a contact position of the first arm with the first stopping surface as a point of application of force, pushes the movable apparatus to move from the removed position to the assembled position. When the handle structure is reversely rotated from the lower pressed position to the upper pulled position, the second arm moves toward the second stopping surface until abutting the second stopping surface, and the handle structure, by using a contact position of the second arm with the second stopping surface as a point of application of force, pushes the movable apparatus to move from the assembled position to the removed position.

In an embodiment of the disclosure, the body includes a body shell and a stopping part. The stopping part is disposed protruding from the body shell. The first stopping surface and the second stopping surface are disposed at the stopping part.

In an embodiment of the disclosure, when the handle structure is at the upper pulled position and the movable apparatus is at the removed position, the second arm abuts the second stopping surface, and the first arm is separated from the first stopping surface. When the handle structure is at the lower pressed position and the movable apparatus is at the assembled position, the first arm abuts the first stopping surface, and the second arm is separated from the second stopping surface.

In an embodiment of the disclosure, the handle structure includes a handle body, a pivot part, a first arm, and a second arm. The handle body comprises one end and another end. The one end has an operation end, and the another end has one side arm and another side arm. The pivot part is disposed at the another end of the handle body and on the one side arm of the handle body. The pivot part is configured to be pivotally disposed to the movable apparatus. The first arm and the second arm are both connected to the another end of the handle body and are both connected to the another side arm of the handle body. The first arm extends toward the second arm. The second arm extends toward the first arm.

In an embodiment of the disclosure, the one side arm of the handle body includes a first connection part. The another side arm of the handle body includes a second connection part. The another end of the handle body further includes an extension part. One end of the extension part is connected to the first connection part and the second connection part. The pivot part is at the first connection part. The first arm and the second arm are at the second connection part, and the operation end is located at an end of the extension part opposite to the one end of the extension part that is connected to the first connection part.

In an embodiment of the disclosure, the handle structure further includes a pushing part. One end of the pushing part is connected to the one side arm of the handle body. Another end of the pushing part extends toward the operation end. The electronic device casing further includes a locking module. The locking module is disposed in the movable apparatus and adapted to move between an unlocking position and a locking position. When the handle structure is at the upper pulled position and the movable apparatus is at the removed position, the pushing part of the handle structure is pushed against the locking module, the locking module is at the unlocking position, and the movable apparatus is adapted to move relative to the body. When the handle structure is at the lower pressed position and the movable apparatus is at the assembled position, the pushing part of the handle structure is separated from the locking module, the locking module is at the locking position, and the movable apparatus is position-limited at the assembled position by the locking module.

In an embodiment of the disclosure, the handle structure further includes a buffer part. The buffer part is connected to the another end of the pushing part and extends from the pushing part in a direction away from the locking module.

In an embodiment of the disclosure, the electronic device casing further includes a locking module. The locking module is disposed in the movable apparatus and adapted to move between an unlocking position and a locking position. When the handle structure is at the upper pulled position and the handle structure is pushed against the locking module, the locking module is at the unlocking position, and the movable apparatus is at the removed position and is adapted to move relative to the body. When the handle structure is at the lower pressed position and the handle structure is separated from the locking module, the locking module is at the locking position, and the movable apparatus is position-limited at the assembled position by the locking module.

In an embodiment of the disclosure, the body has an accommodating space and a gap communicating with the accommodating space. The locking module includes a locking module shell, a force-receiving part, a restoring element, an unlocking part, and a locking part. The locking module shell is fixed to the movable apparatus. The force-receiving part is slidably disposed at the locking module shell and partially protrudes from the locking module shell. The restoring element abuts between the locking module shell and the force-receiving part and is adapted to push the force-receiving part to move toward the movable apparatus. The unlocking part comprises one side connected to the force-receiving part and abuts outside the locking module shell. The unlocking part and the force-receiving part are located on opposite sides of the locking module shell. The locking part is connected to another side of the unlocking part and extends in a direction away from the locking module shell. When the handle structure is at the lower pressed position and the movable apparatus is at the assembled position, the locking part is adapted to be accommodated in the accommodating space and stopped at the gap. When the handle structure is rotated from the lower pressed position to the upper pulled position, the handle structure is pushed against the force-receiving part, the restoring element is deformed, causing the locking part to leave the accommodating space, and the unlocking part is adapted to pass through the gap to allow the movable apparatus to move relative to the body.

In an embodiment of the disclosure, an outer diameter of the unlocking part is less than an inner diameter of the gap. An outer diameter of the locking part is greater than the inner diameter of the gap. When the handle structure is rotated from the lower pressed position to the upper pulled position, the handle structure is pushed against the force-receiving part, the force-receiving part, the unlocking part, and the locking part move in a direction away from the movable apparatus, the locking part leaves the accommodating space, the unlocking part enters the accommodating space, the unlocking part is adapted to move in a direction away from the body into the gap, and the movable apparatus is able to move in a direction away from the body to the removed position.

Based on the above, in the electronic device casing of the disclosure, the movable apparatus is adapted to move between the removed position and the assembled position by rotation of the handle structure between the upper pulled position and the lower pressed position, thereby achieving simple and convenient operation.

In order to make the aforementioned features and advantages of the disclosure comprehensible, embodiments accompanied with drawings are described in detail below.

DESCRIPTION IN THE EMBODIMENTS

Figure 1A:
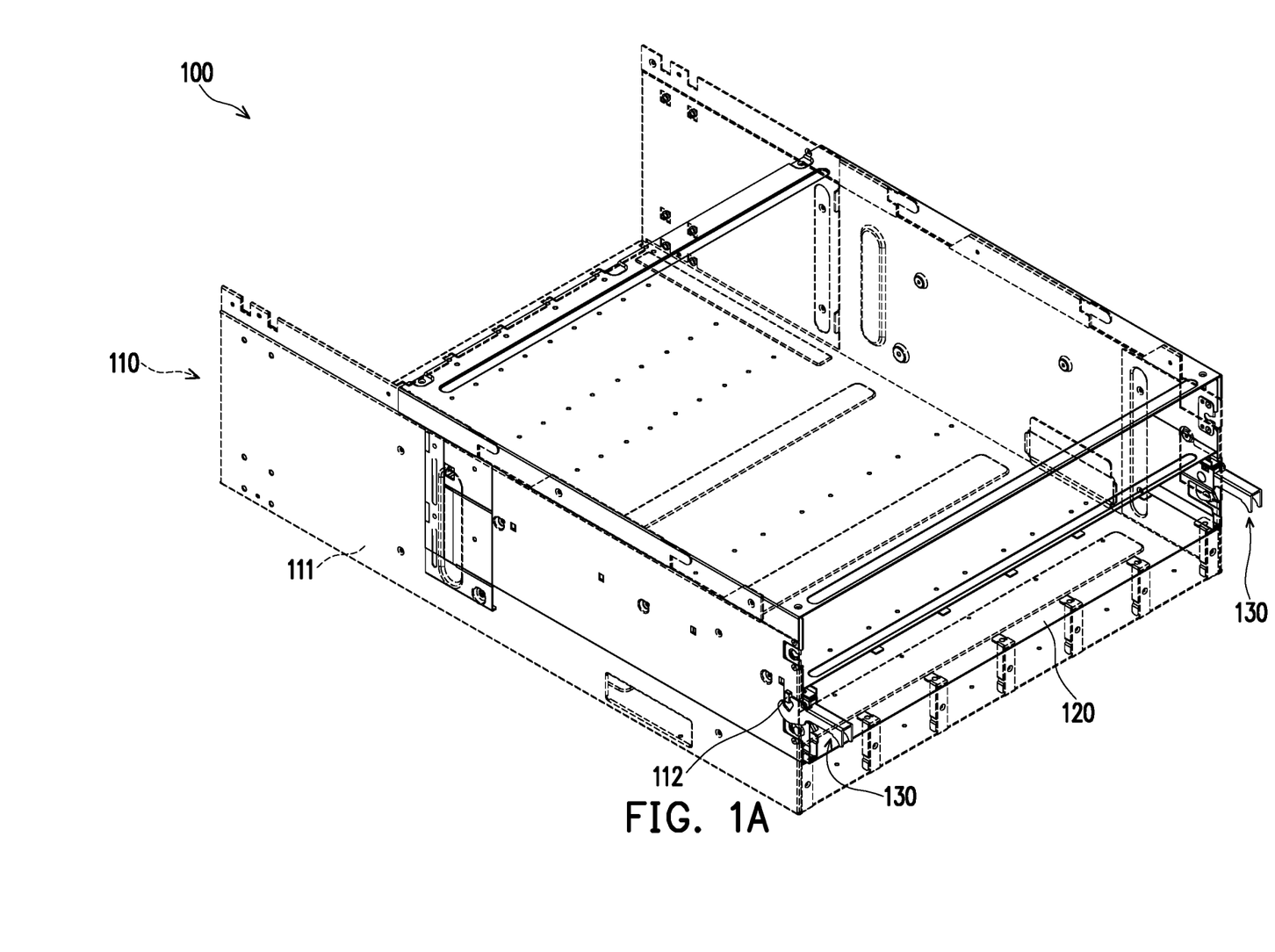
FIG. 1A is a three-dimensional schematic view of an electronic device casing according to an embodiment of the disclosure, with a handle structure at an upper pulled position and a movable apparatus at a removed position.
Figure 1B:
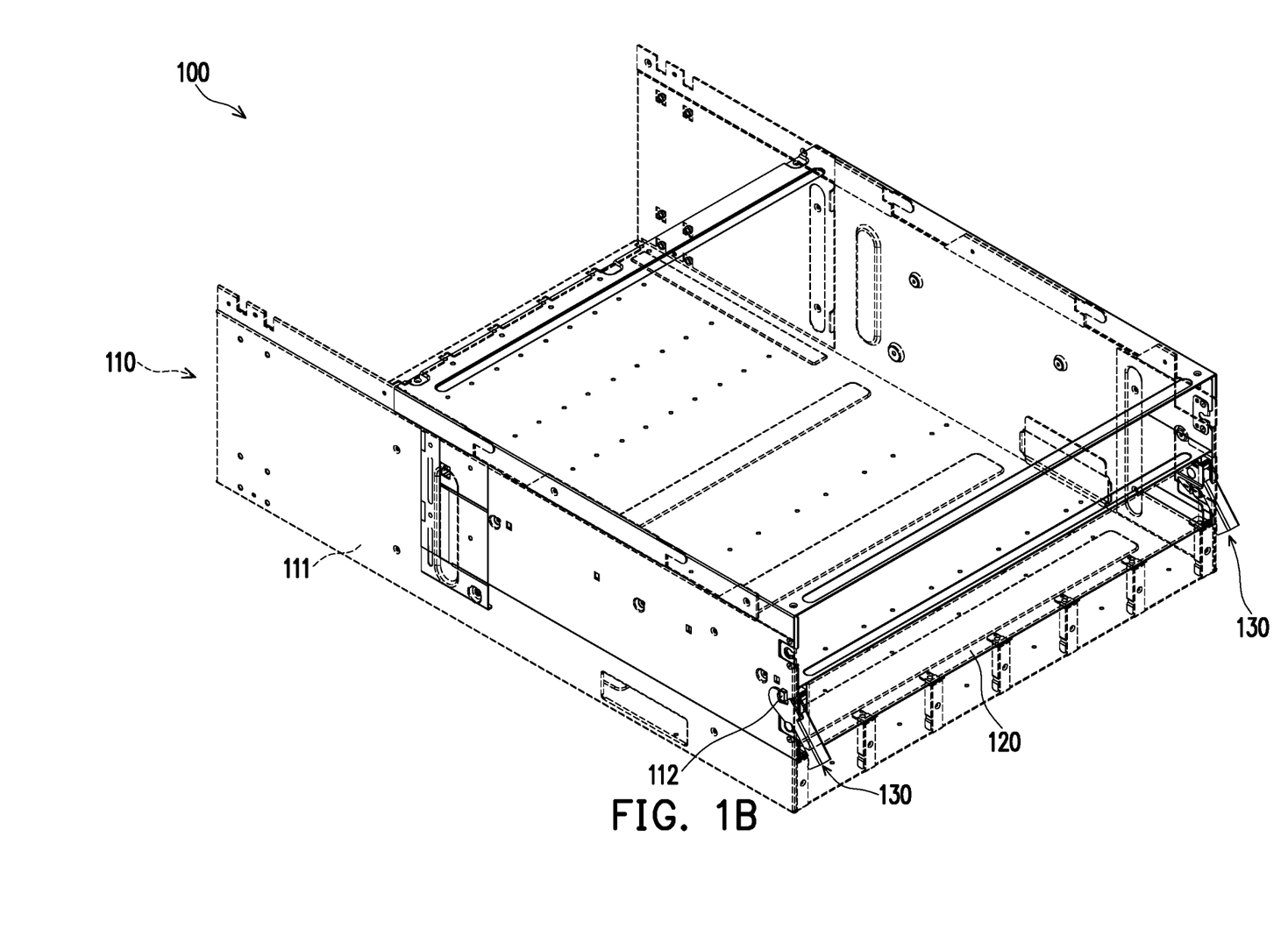
FIG. 1B is a three-dimensional schematic view of the electronic device casing of FIG. 1A, with the handle structure at a lower pressed position and the movable apparatus at an assembled position.
Figure 2A:
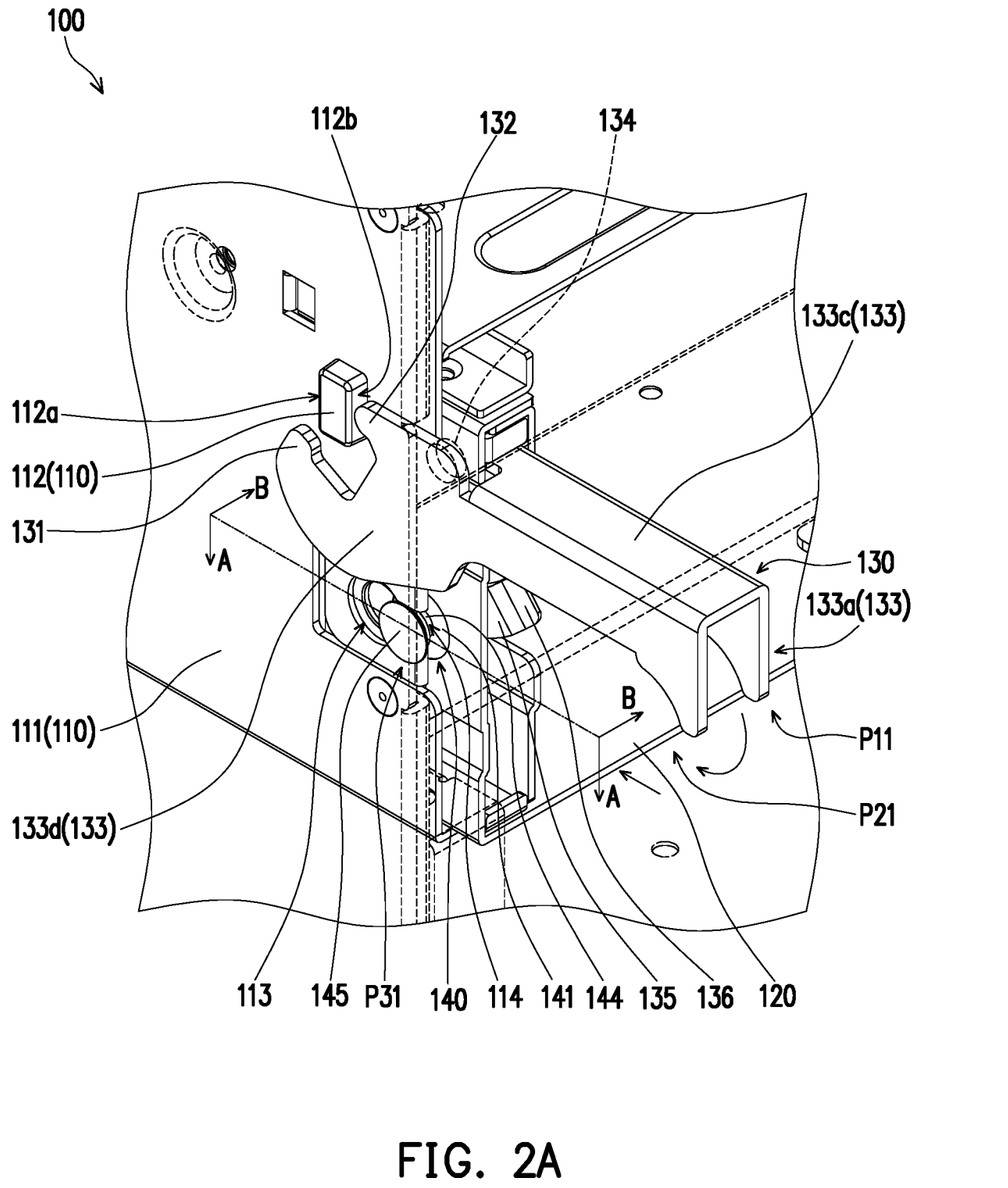
FIG. 2A is a partially enlarged schematic view of the electronic device casing of FIG. 1A.
Figure 2B:
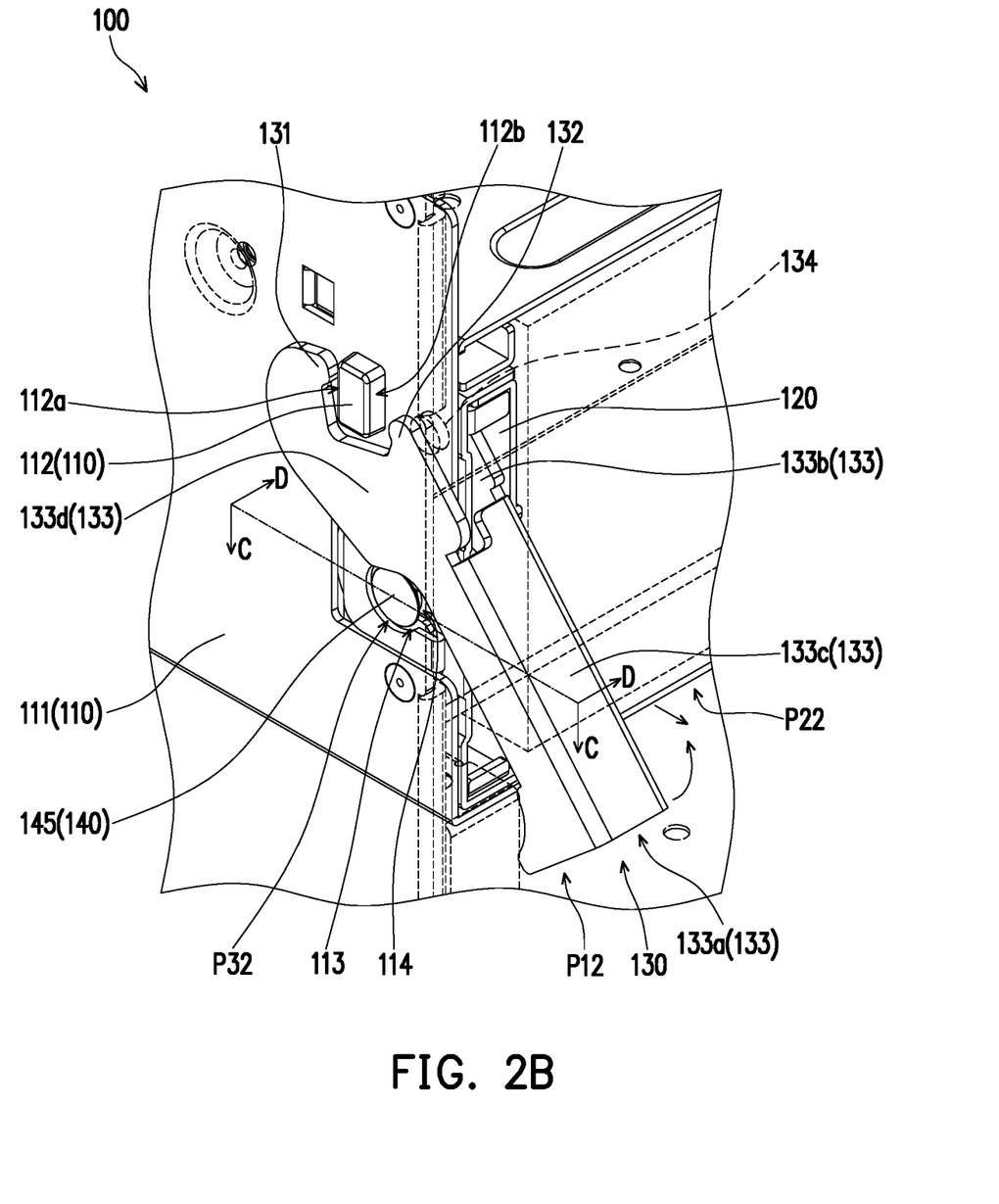
FIG. 2B is a partially enlarged schematic view of the electronic device casing of FIG. 1B.

FIG. 1A is a three-dimensional schematic view of an electronic device casing according to an embodiment of the disclosure, with a handle structure at an upper pulled position and a movable apparatus at a removed position. FIG. 1B is a three-dimensional schematic view of the electronic device casing of FIG. 1A, with the handle structure at a lower pressed position and the movable apparatus at an assembled position. FIG. 2A is a partially enlarged schematic view of the electronic device casing of FIG. 1A. FIG. 2B is a partially enlarged schematic view of the electronic device casing of FIG. 1B. Referring to FIG. 1A, FIG. 1B, FIG. 2A, and FIG. 2B, in the embodiment, an electronic device casing 100 includes a body 110, a movable apparatus 120, and a handle structure 130. The body 110 comprises a first stopping surface 112a and a second stopping surface 112b disposed opposite to each other. The body 110 is, for example but not limited to, a server cabinet. The movable apparatus 120 can be assembled to the body 110, and is, for example but not limited to, a host that can be inserted into the body 110. A plurality of the movable apparatuses 120 may be inserted in the body 110, and the handle structure 130 is disposed in a symmetrical manner at each of opposite side edges of each movable apparatus 120. The handle structure 130 is pivotally disposed to the movable apparatus 120. The handle structure 130 comprises a first arm 131 corresponding to the first stopping surface 112a and a second arm 132 corresponding to the second stopping surface 112b. Note that, in order to clearly show the handle structure 130, a part of the body 110 and the movable apparatus 120 are shown with dotted lines in FIG. 1A, FIG. 1B, FIG. 2A, and FIG. 2B.

The handle structure 130 is rotatable between an upper pulled position P11 shown in FIG. 2A and a lower pressed position P12 shown in FIG. 2B so that the movable apparatus 120 can be moved between a removed position P21 shown in FIG. 2A and an assembled position P22 shown in FIG. 2B.

Referring to FIG. 1A and FIG. 2A, when the handle structure 130 is at the upper pulled position P11 and the movable apparatus 120 is at the removed position P21, the second arm 132 abuts the second stopping surface 112b, and the first arm 131 is separated from the first stopping surface 112a. When the handle structure 130 is rotated forward from the upper pulled position P11 shown in FIG. 2A to the lower pressed position P12 shown in FIG. 2B, the first arm 131 moves toward the first stopping surface 112a until abutting the first stopping surface 112a, and the handle structure 130, by using a contact position of the first arm 131 with the first stopping surface 112a as a point of application of force, pushes the movable apparatus 120 from the removed position P21 shown in FIG. 2A to the assembled position P22 shown in FIG. 2B.

Referring to FIG. 1B and FIG. 2B, when the handle structure 130 is at the lower pressed position P12 and the movable apparatus 120 is at the assembled position P22, the first arm 131 abuts the first stopping surface 112a, and the second arm 132 is separated from the second stopping surface 112b. When the handle structure 130 is reversely rotated from the lower pressed position P12 shown in FIG. 2B to the upper pulled position P11 shown in FIG. 2A, the second arm 132 moves toward the second stopping surface 112b and abuts the second stopping surface 112b, and the handle structure 130, by using a contact position of the second arm 132 with the second stopping surface 112b as a point of application of force, pushes the movable apparatus 120 outward from the assembled position P22 shown in FIG. 2B to the removed position P21 shown in FIG. 2A.

Referring to FIG. 2A and FIG. 2B, the body 110 in the embodiment includes a body shell 111 and a stopping part 112. The stopping part 112 is disposed protruding from the body shell 111. The first stopping surface 112a and the second stopping surface 112b are disposed at opposite sides of the stopping part 112. More specifically, the first stopping surface 112a and the second stopping surface 112b are disposed at opposite front and rear sides of the stopping part 112 in a direction corresponding to a moving direction of the movable apparatus 120.

Figure 3A:
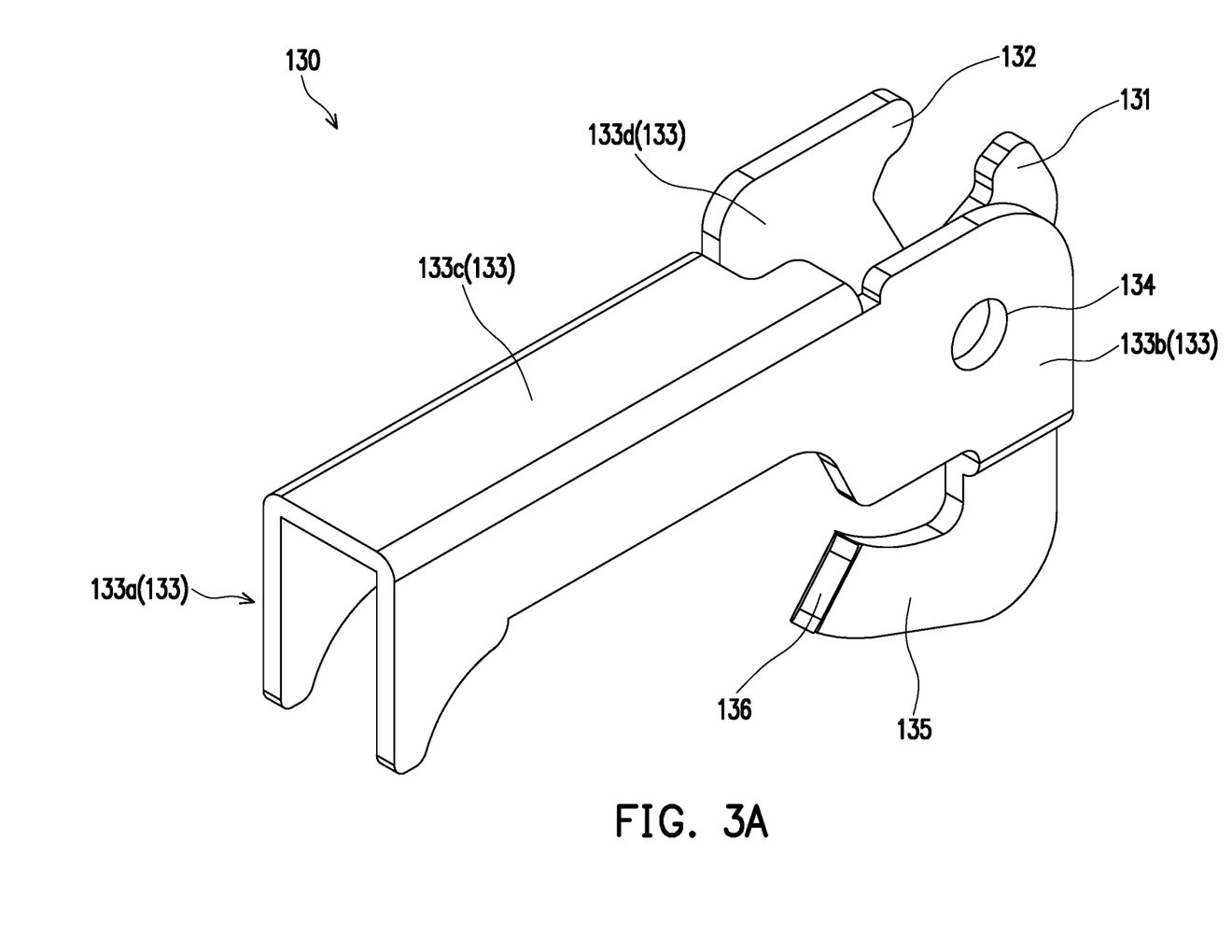
FIG. 3A and FIG. 3B are schematic views of the handle structure of FIG. 1A from different viewing angles.
Figure 3B:
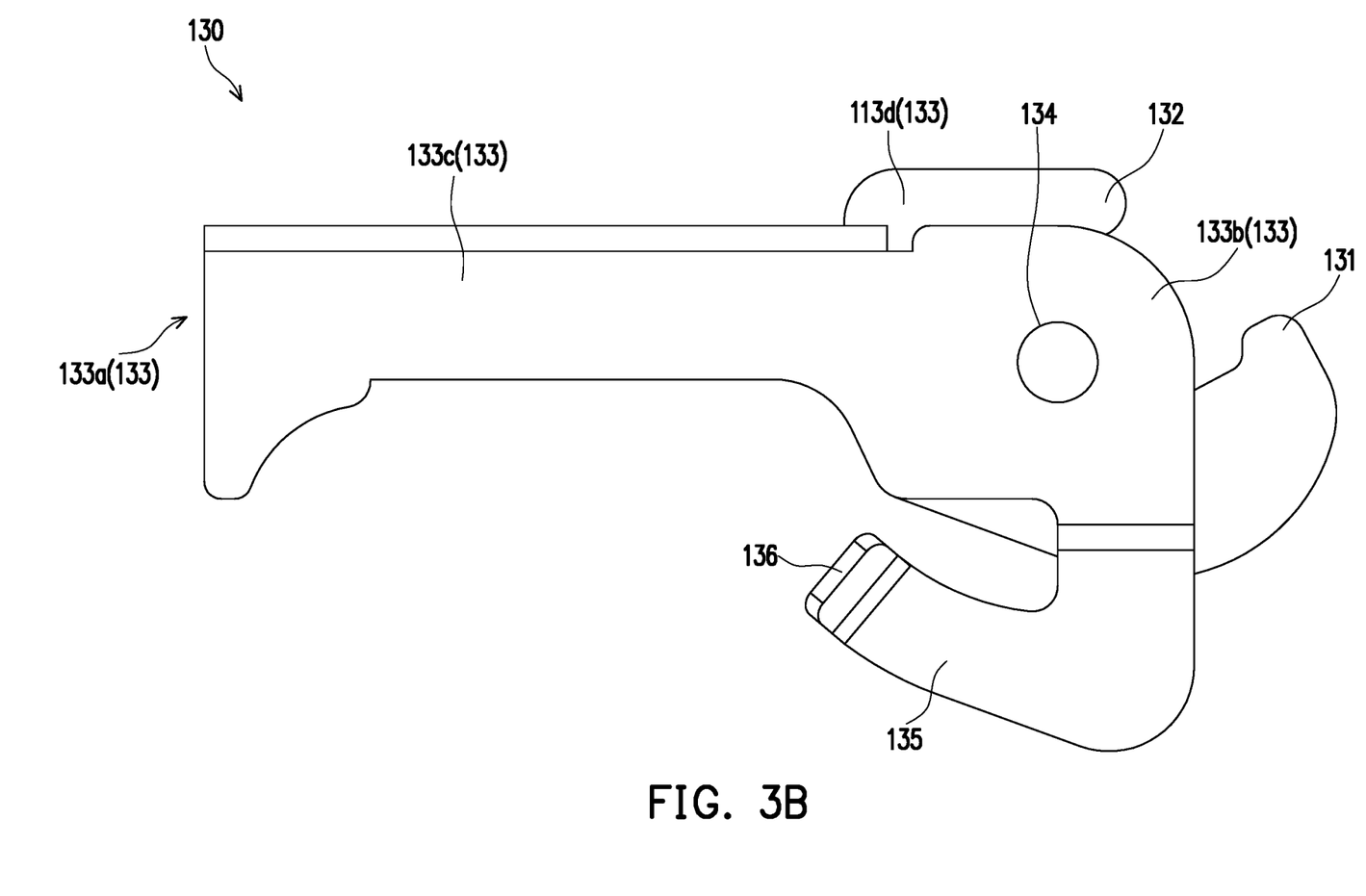

FIG. 3A and FIG. 3B are schematic views of the handle structure of FIG. 1A from different viewing angles. Referring to FIG. 2A, FIG. 2B, FIG. 3A, and FIG. 3B, the handle structure 130 in the embodiment includes a handle body 133, a pivot part 134, the first arm 131 and the second arm 132. The handle body 133 includes one end and another end. The another end has one side arm and another side arm. The one end of the handle body 133 has an operation end 133a. The pivot part 134 is disposed at the another end of the handle body 133. The pivot part 134 is configured to be pivotally disposed to the movable apparatus 120. Both the first arm 131 and the second arm 132 are connected to the another end of the handle body 133. The pivot part 134 is located on the one side arm of the handle body 133. Both the first arm 131 and the second arm 132 are connected to the another side arm of the handle body 133. For better understanding, the terms such as "front," "rear," "left," "right," "upper" and "lower" are used in the following descriptions of the relative positions of the various elements with reference to the drawings. In addition, for clear distinction, wherever in the following descriptions of each portion of the handle structure 130, "one end" refers to a front end, "another end" refers to a rear end, "one side arm" refers to a right side arm, and "another side arm" refers to a left side arm. The operation end 133a shown in FIG. 3A is defined as being at the front end, and the relative positions of the other elements are described with the operation end 133a as a reference. The operation end 133a is located at the front end of the handle body 133. The first arm 131 is located at the rear end of the handle body 133 near the left side arm. The second arm 132 is located at the rear end of the handle body 133 near the left side arm. The pivot part 134 is located at the rear end of the handle body 133 near the right side arm. The first arm 131 extends toward the second arm 132, and the second arm 132 extends toward the first arm 131. In other words, the first arm 131 and the second arm 132 extend toward each other. The operation end 133a and the first arm 131 are located at opposite ends of the handle body 133. The operation end 133a and the second arm 132 are located at opposite ends of the handle body 133. The operation end 133a and the pivot part 134 are located at opposite ends of the handle body 133. The first arm 131 and the pivot part 134 are located at opposite side arms of the handle body 133. The second arm 132 and the pivot part 134 are located at opposite side arms of the handle body 133.

Furthermore, the one side arm of the handle body 133 includes a first connection part 133b. The another side arm of the handle body 133 includes a second connection part 133d. The another end of the handle body 133 further includes an extension part 133c, and one end of the extension part 133c is connected to the first connection part 133b and the second connection part 133d. The pivot part 134 is located at the first connection part 133b. The pivot part 134 is, for example but not limited to, a pivot hole. In other embodiments, the pivot part may also be a hinge. The first arm 131 and the second arm 132 are located at the second connection part 133d, and the operation end 133a is located at an end of the extension part 133c opposite to the one end of the extension part 133c that is connected to the first connection part 133b. Hereinafter, the positions and directions of each portion of the handle structure 130 are described in the same manner as the foregoing and repeated description will be omitted.

In addition, from the viewing angle of FIG. 3B, the first arm 131 and the extension part 133c of the handle body 133 are located at opposite ends of the pivot part 134. The second arm 132 and the extension part 133c of the handle body 133 are located at opposite ends of the pivot part 134.

Figure 4A:
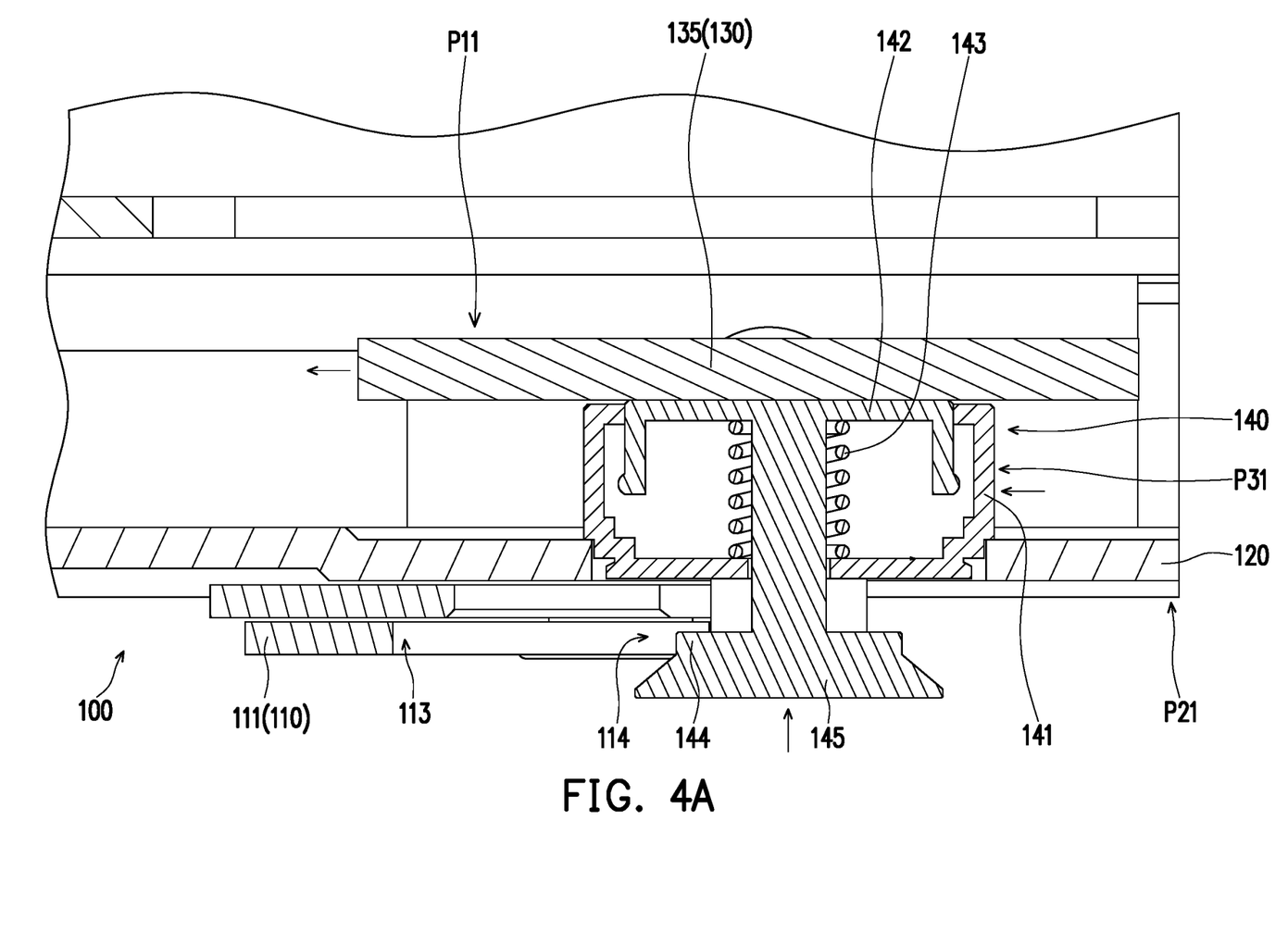
FIG. 4A is a partial schematic cross-sectional view taken along a line A-A of FIG. 2A.
Figure 4B:
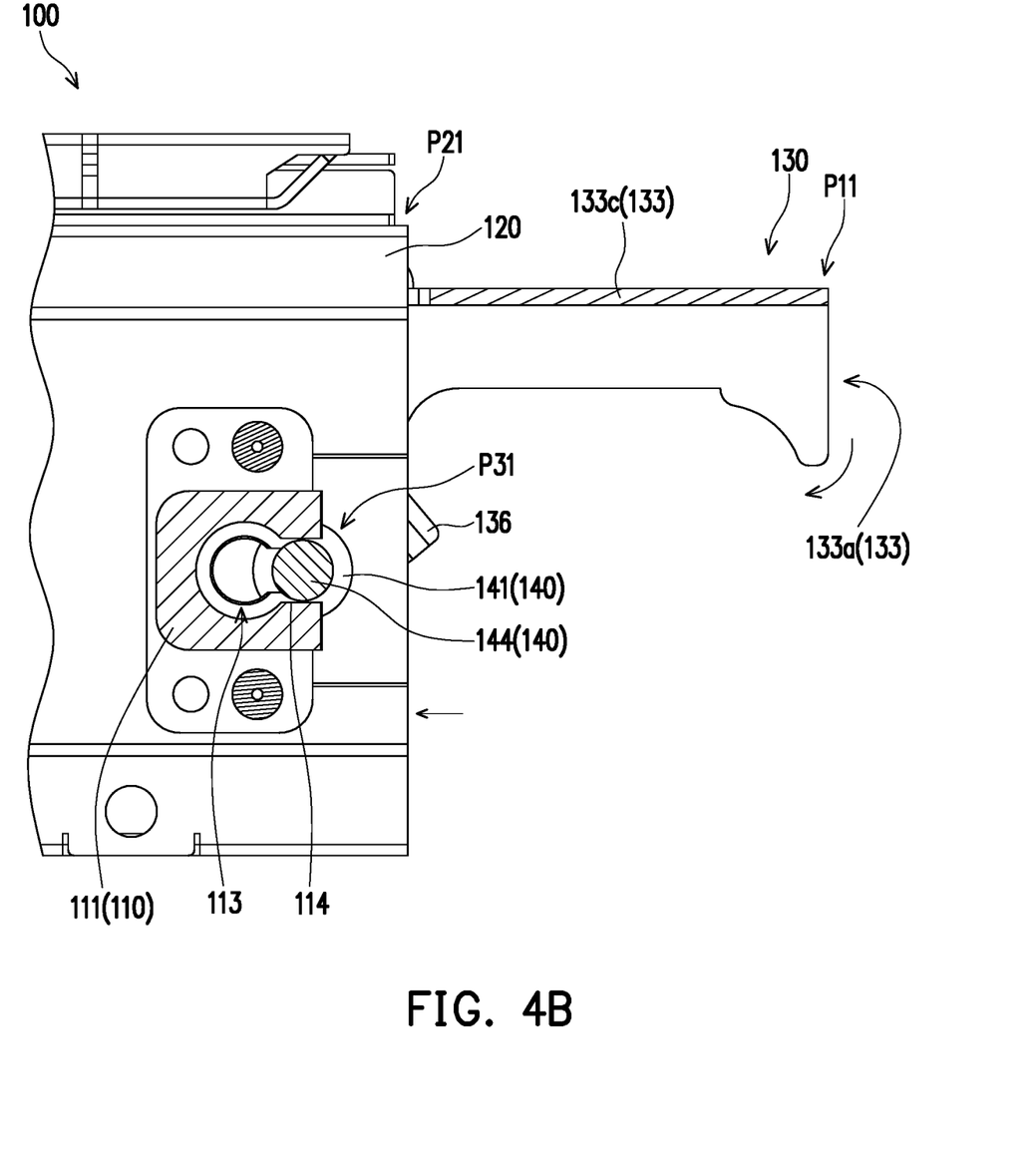
FIG. 4B is a partial schematic cross-sectional view taken along a line B-B in FIG. 2A.
Figure 5A:
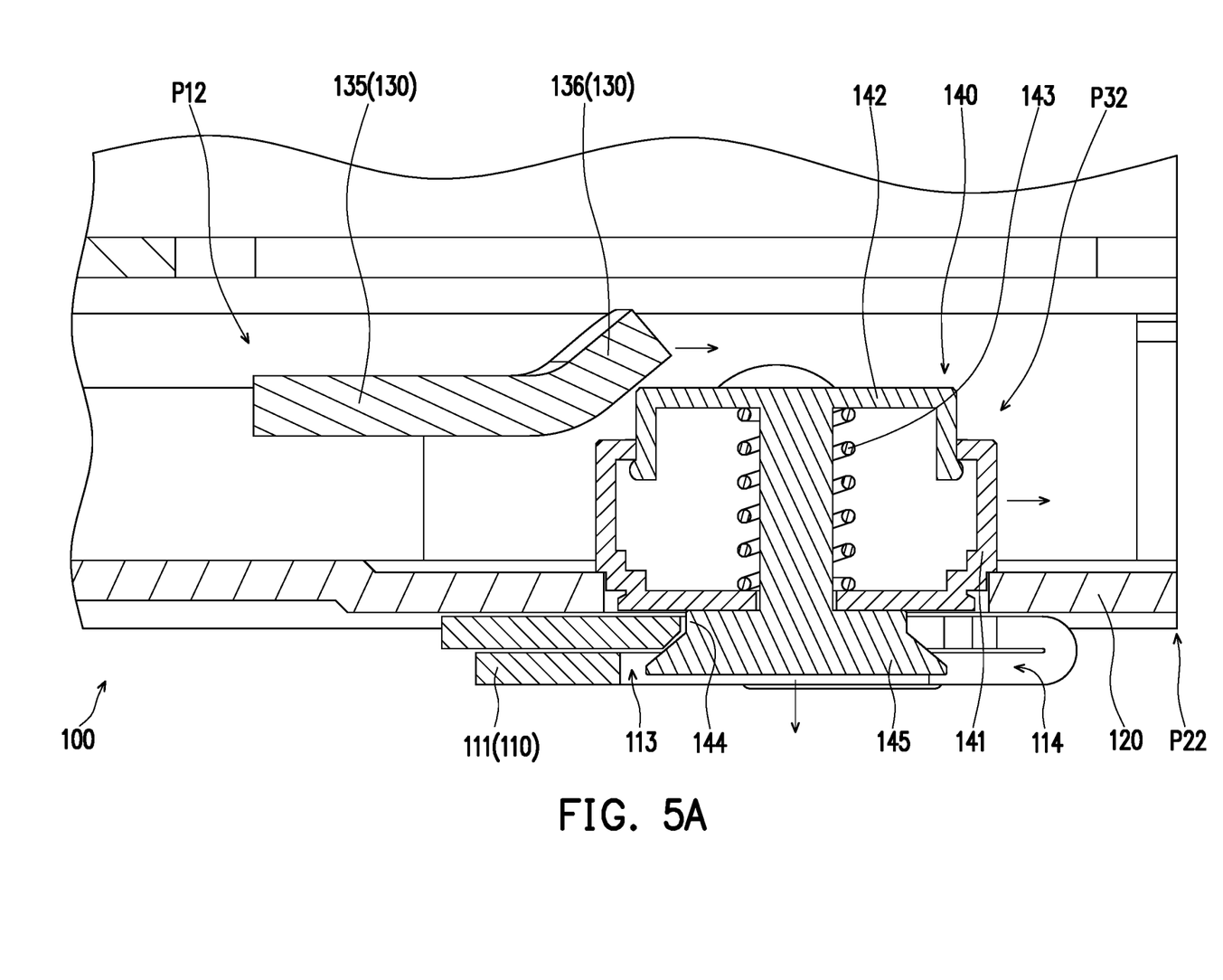
FIG. 5A is a partial schematic cross-sectional view taken along a line C-C in FIG. 2B.
Figure 5B:
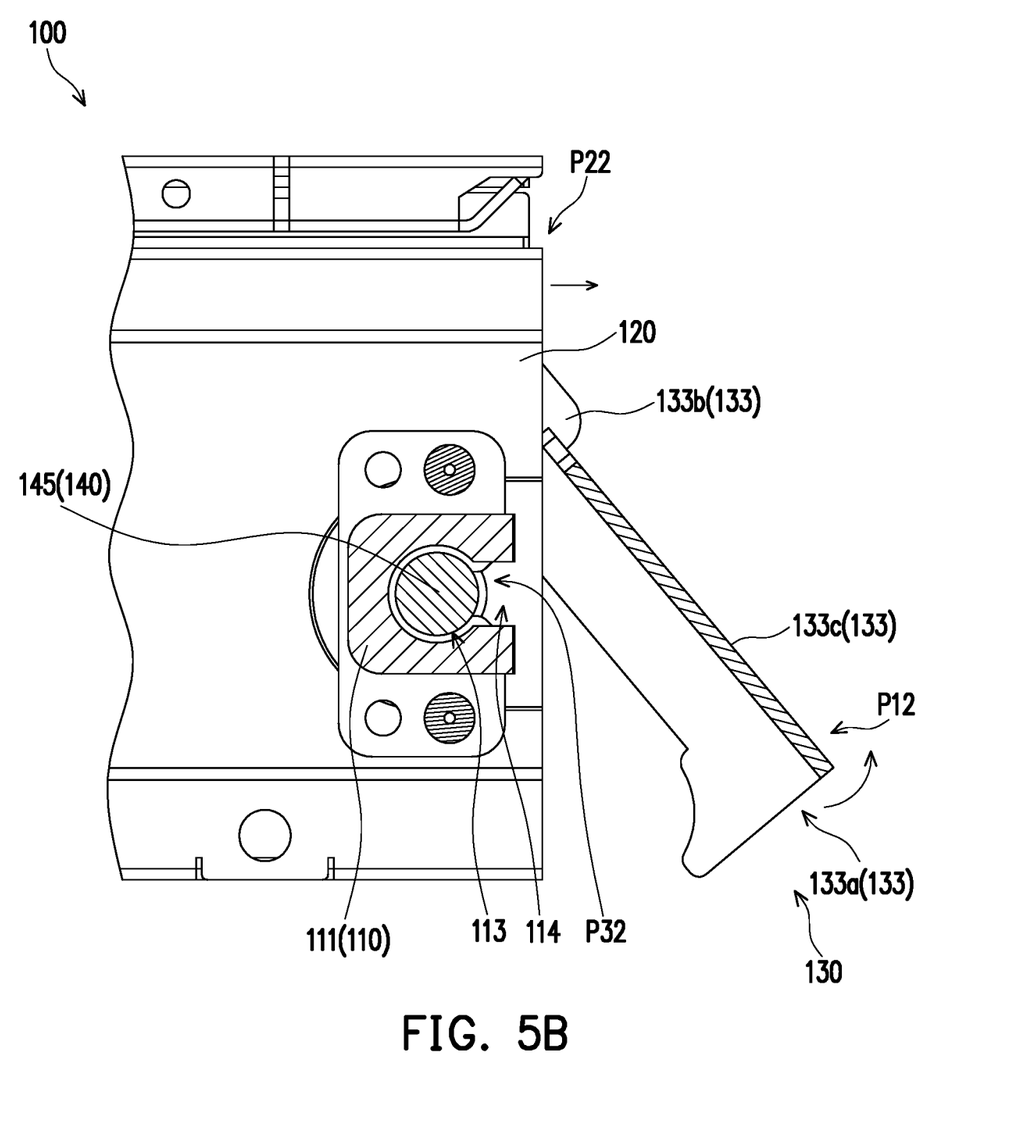
FIG. 5B is a partial schematic cross-sectional view taken along a line D-D in FIG. 2B.

FIG. 4A is a partial schematic cross-sectional view taken along a line A-A of FIG. 2A. FIG. 4B is a partial schematic cross-sectional view taken along a line B-B in FIG. 2A. FIG. 5A is a partial schematic cross-sectional view taken along a line C-C in FIG. 2B. FIG. 5B is a partial schematic cross-sectional view taken along a line D-D in FIG. 2B. Referring to FIG. 4A, FIG. 4B, FIG. 5A, and FIG. 5B, the handle structure 130 in the embodiment further includes a pushing part 135 and a buffer part 136. The body 110 has an accommodating space 113 and a gap 114. The electronic device casing 100 further includes a locking module 140. The locking module 140 is disposed in the movable apparatus 120. A front end of the pushing part 135 extends toward the operation end 133a. A rear end of the pushing part 135 is connected to the first connection part 133b of the handle body 133. The buffer part 136 is connected to the front end of the pushing part 135 and extends from the pushing part 135 in a direction away from the locking module 140.

Referring to FIG. 2A, FIG. 3A, FIG. 4A, and FIG. 4B, when the handle structure 130 is at the upper pulled position P11 shown in FIG. 4B, the pushing part 135 of the handle structure 130 is pushed against the locking module 140 as shown in FIG. 4A, the locking module 140 is located at an unlocking position P31, and the movable apparatus 120 is capable of moving relative to the body 110.

Referring to FIG. 2B, FIG. 3A, FIG. 5A, and FIG. 5B, the locking module 140 in the embodiment is movable between the unlocking position P31 shown in FIG. 4A and a locking position P32 shown in FIG. 5A. When the handle structure 130 is at the lower pressed position P12 shown in FIG. 5B, the pushing part 135 of the handle structure 130 is separated from the locking module 140 as shown in FIG. 5A, the locking module 140 is located at the locking position P32, and the movable apparatus 120 is position-limited at the assembled position P22 shown in FIG. 2B by the locking module 140.

Specifically, referring to FIG. 4A, FIG. 4B, FIG. 5A, and FIG. 5B, the locking module 140 in the embodiment includes a locking module shell 141, a force-receiving part 142, a restoring element 143, an unlocking part 144, and a locking part 145. The locking module shell 141 is fixed to the movable apparatus 120. The force-receiving part 142 is slidably disposed at the locking module shell 141 and partially protrudes from the locking module shell 141. The restoring element 143 abuts between the locking module shell 141 and the force-receiving part 142 and is capable of pushing the force-receiving part 142 to move toward the movable apparatus 120. One side of the unlocking part 144 is connected to the force-receiving part 142 and abuts outside the locking module shell 141. Another side of the unlocking part 144 is connected to the locking part 145. The unlocking part 144 and the force-receiving part 142 are located on opposite sides of the locking module shell 141. The locking part 145 extends in a direction away from the locking module shell 141. When the handle structure 130 is at the lower pressed position P12 shown in FIG. 5B and the movable apparatus 120 is at the assembled position P22 shown in FIG. 2B, the locking part 145 may be accommodated in the accommodating space 113 as shown in FIG. 5A and be stopped at the gap 114 as shown in FIG. 5B. When the handle structure 130 is reversely rotated from the lower pressed position P12 to the upper pulled position P11 shown in FIG. 4B, the handle structure 130 is pushed against the force-receiving part 142 as shown in FIG. 4A, the restoring element 143 is deformed, causing the locking part 145 to leave the accommodating space 113. Meanwhile, the second arm 132 moves toward the second stopping surface 112*b* until abutting the second stopping surface 112*b*, and the unlocking part 144 may pass through the gap 114 as shown in FIG. 4B to allow the movable apparatus 120 to move relative to the body 110.

More specifically, referring to FIG. 4A, FIG. 4B, FIG. 5A, and FIG. 5B, an outer diameter of the unlocking part 144 is less than an inner diameter of the gap 114 as shown in FIG. 4B, and an outer diameter of the locking part 145 is greater than the inner diameter of the gap 114 as shown in FIG. 5B. When the handle structure 130 is at the lower pressed position P12 shown in FIG. 5B and the movable apparatus 120 is at the assembled position P22 shown in FIG. 2B, a force is applied to rotate the handle structure 130 from the lower pressed position P12 shown in FIG. 5B to the upper pulled position P11 shown in FIG. 4B. The pushing part 135 of the handle structure 130 moves in a direction away from the body 110 as shown in FIG. 5A and is pushed against the force-receiving part 142 of the locking module 140 as shown in FIG. 4A. The force-receiving part 142, the unlocking part 144, and the locking part 145 move in a direction away from the movable apparatus 120 as shown in FIG. 5A. The locking part 145 leaves the accommodating space 113 as shown in FIG. 4A, and the unlocking part 144 enters the accommodating space 113 as shown in FIG. 4A. In response to the second arm 132 moving toward the second stopping surface 112*b* until abutting the second stopping surface 112*b*, the unlocking part 144 is adapted to move in a direction away from the body 110 into the gap 114 as shown in FIG. 4B, so that the movable apparatus 120 is able to move in a direction away from the body 110 to the removed position P21.

In contrast, when the handle structure 130 is at the upper pulled position P11 shown in FIG. 4B and the movable apparatus 120 is at the removed position P21, a force is applied to rotate the handle structure 130 from the upper pulled position P11 shown in FIG. 4B to the lower pressed position P12 shown in FIG. 5B. The pushing part 135 of the handle structure 130 moves toward the body 110 as shown in FIG. 4A until being separated from the force-receiving part 142 of the locking module 140 as shown in FIG. 5A, and drives the unlocking part 144 to move toward the body 110 and leave the gap 114 as shown in FIG. 4A. The restoring element 143 obtains a restoring force in response to the leaving of the pushing part 135 and drives the force-receiving part 142, the unlocking part 144, and the locking part 145 to move toward the movable apparatus 120 as shown in FIG. 4A. In other words, the unlocking part 144 first moves toward the movable apparatus 120 as shown in FIG. 4B and then leaves the accommodating space 113 as shown in FIG. 5A; the locking part 145 enters the accommodating space 113 as shown in FIG. 5A; and the movable apparatus 120 moves toward the body 110 as shown in FIG. 4B.

In summary, in the electronic device casing of the disclosure, the movable apparatus is adapted to move between the removed position and the assembled position by rotation of the handle structure between the upper pulled position and the lower pressed position, thereby achieving simple and convenient operation.

Although the disclosure has been described with reference to the above embodiments, it will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. An electronic device casing, comprising:
   a body comprising a first stopping surface and a second stopping surface disposed opposite to each other;
   a movable apparatus adapted to be detachably assembled in the body; and
   a handle structure pivotally disposed to the movable apparatus and comprising a first arm corresponding to the first stopping surface and a second arm corresponding to the second stopping surface, wherein the handle structure is rotatable between an upper pulled position and a lower pressed position to adapt the movable apparatus to move between a removed position and an assembled position, wherein when the handle structure is rotated forward from the upper pulled position to the lower pressed position, the first arm moves toward the first stopping surface until abutting the first stopping surface, and the handle structure, by using a contact position of the first arm with the first stopping surface as a point of application of force, pushes the movable apparatus to move from the removed position to the assembled position; and when the handle structure is reversely rotated from the lower pressed position to the upper pulled position, the second arm moves toward the second stopping surface until abutting the second stopping surface, and the handle structure, by using a contact position of the second arm with the second stopping surface as a point of application of force, pushes the movable apparatus to move from the assembled position to the removed position,
   wherein the handle structure further comprises:
   a handle body comprising one end and another end, wherein the one end has an operation end, and the another end has one side arm and another side arm, and
   a pivot part disposed at the one side arm of the handle body and configured to be pivotally disposed to the movable apparatus;
   wherein the one side arm of the handle body comprises a first connection part, the another side arm of the handle body comprises a second connection part, the another end of the handle body further comprises an extension part, and one end of the extension part is connected to the first connection part and the second connection part;
wherein the pivot part is at the first connection part, the first arm and the second arm are at the second connection part, and the operation end is located at an end of the extension part opposite to the one end of the extension part that is connected to the first connection part.

2. The electronic device casing according to claim 1, wherein the body comprises:
a body shell; and
a stopping part disposed protruding from the body shell, wherein the first stopping surface and the second stopping surface are disposed at the stopping part.

3. The electronic device casing according to claim 1, wherein when the handle structure is at the upper pulled position and the movable apparatus is at the removed position, the second arm abuts the second stopping surface, and the first arm is separated from the first stopping surface; and when the handle structure is at the lower pressed position and the movable apparatus is at the assembled position, the first arm abuts the first stopping surface, and the second arm is separated from the second stopping surface.

4. The electronic device casing according to claim 1, wherein
the first arm is connected to the another side arm of the handle body and extending toward the second arm; and
the second arm is connected to the another side arm of the handle body and extending toward the first arm.

5. The electronic device casing according to claim 4, wherein the handle structure further comprises a pushing part, one end of the pushing part is connected to the one side arm of the handle body, another end of the pushing part extends toward the operation end, and the electronic device casing further comprises:
a locking module disposed in the movable apparatus and adapted to move between an unlocking position and a locking position, wherein when the handle structure is at the upper pulled position and the movable apparatus is at the removed position, the pushing part of the handle structure is pushed against the locking module, the locking module is at the unlocking position, and the movable apparatus is adapted to move relative to the body; and when the handle structure is at the lower pressed position and the movable apparatus is at the assembled position, the pushing part of the handle structure is separated from the locking module, the locking module is at the locking position, and the movable apparatus is position-limited at the assembled position by the locking module.

6. The electronic device casing according to claim 5, wherein the handle structure further comprises:
a buffer part connected to the another end of the pushing part and extending from the pushing part in a direction away from the locking module.

7. The electronic device casing according to claim 1, further comprising:
a locking module disposed in the movable apparatus and adapted to move between an unlocking position and a locking position, wherein when the handle structure is at the upper pulled position and the handle structure is pushed against the locking module, the locking module is at the unlocking position, and the movable apparatus is at the removed position and is adapted to move relative to the body; and when the handle structure is at the lower pressed position and the handle structure is separated from the locking module, the locking module is at the locking position, and the movable apparatus is position-limited at the assembled position by the locking module.

8. The electronic device casing according to claim 7, wherein the body has an accommodating space and a gap communicating with the accommodating space, and the locking module comprises:
a locking module shell fixed to the movable apparatus;
a force-receiving part slidably disposed at the locking module shell and partially protruding from the locking module shell;
a restoring element abutting between the locking module shell and the force-receiving part and adapted to push the force-receiving part to move toward the movable apparatus;
an unlocking part comprising one side connected to the force-receiving part and abutting outside the locking module shell, wherein the unlocking part and the force-receiving part are located on opposite sides of the locking module shell; and
a locking part connected to another side of the unlocking part and extending in a direction away from the locking module shell, wherein when the handle structure is at the lower pressed position and the movable apparatus is at the assembled position, the locking part is adapted to be accommodated in the accommodating space and stopped at the gap; and when the handle structure is rotated from the lower pressed position to the upper pulled position, the handle structure is pushed against the force-receiving part, the restoring element is deformed, causing the locking part to leave the accommodating space, and the unlocking part is adapted to pass through the gap to allow the movable apparatus to move relative to the body.

9. The electronic device casing according to claim 8, wherein an outer diameter of the unlocking part is less than an inner diameter of the gap; an outer diameter of the locking part is greater than the inner diameter of the gap; when the handle structure is rotated from the lower pressed position to the upper pulled position, the handle structure is pushed against the force-receiving part, the force-receiving part, the unlocking part, and the locking part move in a direction away from the movable apparatus, the locking part leaves the accommodating space, the unlocking part enters the accommodating space, the unlocking part is adapted to move in a direction away from the body into the gap, and the movable apparatus is able to move in a direction away from the body to the removed position.

10. An electronic device casing, comprising:
a body comprising a first stopping surface and a second stopping surface disposed opposite to each other;
a movable apparatus adapted to be detachably assembled in the body;
a handle structure pivotally disposed to the movable apparatus and comprising a first arm corresponding to the first stopping surface and a second arm corresponding to the second stopping surface, wherein the handle structure is rotatable between an upper pulled position and a lower pressed position to adapt the movable apparatus to move between a removed position and an assembled position, wherein when the handle structure is rotated forward from the upper pulled position to the lower pressed position, the first arm moves toward the first stopping surface until abutting the first stopping surface, and the handle structure, by using a contact position of the first arm with the first stopping surface as a point of application of force, pushes the movable apparatus to move from the removed position to the assembled position; and when the handle structure is reversely rotated from the lower pressed position to the upper pulled position, the second arm moves toward the second stopping surface until abutting the second stopping surface, and the handle structure, by using a contact position of the second arm with the second stopping surface as a point of application of force, pushes the movable apparatus to move from the assembled position to the removed position; and a locking module disposed in the movable apparatus and adapted to move between an unlocking position and a locking position, wherein when the handle structure is at the upper pulled position and the handle structure is pushed against the locking module, the locking module is at the unlocking position, and the movable apparatus is at the removed position and is adapted to move relative to the body; and when the handle structure is at the lower pressed position and the handle structure is separated from the locking module, the locking module is at the locking position, and the movable apparatus is position-limited at the assembled position by the locking module, the locking module comprises:

a locking module shell fixed to the movable apparatus; and a force-receiving part slidably disposed at the locking module shell and partially protruding from the locking module shell;

wherein when the handle structure is rotated from the lower pressed position to the upper pulled position, the handle structure is pushed against the force-receiving part, and when the handle structure is rotated from the upper pulled position to the lower pressed position, the handle structure is separated from the force-receiving part.

11. The electronic device casing according to claim 10, wherein the body comprises:

a body shell; and a stopping part disposed protruding from the body shell, wherein the first stopping surface and the second stopping surface are disposed at the stopping part.

12. The electronic device casing according to claim 10, wherein when the handle structure is at the upper pulled position and the movable apparatus is at the removed position, the second arm abuts the second stopping surface, and the first arm is separated from the first stopping surface; and when the handle structure is at the lower pressed position and the movable apparatus is at the assembled position, the first arm abuts the first stopping surface, and the second arm is separated from the second stopping surface.

13. The electronic device casing according to claim 10, wherein the handle structure further comprises a pushing part, one end of the pushing part is connected to the one side arm of the handle body, another end of the pushing part extends toward the operation end, and the electronic device casing further comprises:

a locking module disposed in the movable apparatus and adapted to move between an unlocking position and a locking position, wherein when the handle structure is at the upper pulled position and the movable apparatus is at the removed position, the pushing part of the handle structure is pushed against the locking module, the locking module is at the unlocking position, and the movable apparatus is adapted to move relative to the body; and when the handle structure is at the lower pressed position and the movable apparatus is at the assembled position, the pushing part of the handle structure is separated from the locking module, the locking module is at the locking position, and the movable apparatus is position-limited at the assembled position by the locking module.

14. The electronic device casing according to claim 13, wherein the handle structure further comprises:

a buffer part connected to the another end of the pushing part and extending from the pushing part in a direction away from the locking module.

15. The electronic device casing according to claim 10, wherein the body has an accommodating space and a gap communicating with the accommodating space, and the locking module comprises:

a restoring element abutting between the locking module shell and the force-receiving part and adapted to push the force-receiving part to move toward the movable apparatus;

an unlocking part comprising one side connected to the force-receiving part and abutting outside the locking module shell, wherein the unlocking part and the force-receiving part are located on opposite sides of the locking module shell; and a locking part connected to another side of the unlocking part and extending in a direction away from the locking module shell, wherein when the handle structure is at the lower pressed position and the movable apparatus is at the assembled position, the locking part is adapted to be accommodated in the accommodating space and stopped at the gap; and when the handle structure is rotated from the lower pressed position to the upper pulled position, the handle structure is pushed against the force-receiving part, the restoring element is deformed, causing the locking part to leave the accommodating space, and the unlocking part is adapted to pass through the gap to allow the movable apparatus to move relative to the body.

16. The electronic device casing according to claim 15, wherein an outer diameter of the unlocking part is less than an inner diameter of the gap; an outer diameter of the locking part is greater than the inner diameter of the gap; when the handle structure is rotated from the lower pressed position to the upper pulled position, the handle structure is pushed against the force-receiving part, the force-receiving part, the unlocking part, and the locking part move in a direction away from the movable apparatus, the locking part leaves the accommodating space, the unlocking part enters the accommodating space, the unlocking part is adapted to move in a direction away from the body into the gap, and the movable apparatus is able to move in a direction away from the body to the removed position.

* * * * *